US008225178B2

(12) United States Patent
Nakaigawa

(10) Patent No.: US 8,225,178 B2
(45) Date of Patent: Jul. 17, 2012

(54) SEMICONDUCTOR MEMORY DEVICE

(75) Inventor: Sachio Nakaigawa, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 724 days.

(21) Appl. No.: 12/382,482

(22) Filed: Mar. 17, 2009

(65) Prior Publication Data

US 2009/0249167 A1 Oct. 1, 2009

(30) Foreign Application Priority Data

Mar. 31, 2008 (JP) ................. 2008-091544

(51) Int. Cl.
*G11C 29/00* (2006.01)

(52) U.S. Cl. ........ 714/763; 714/710; 714/711; 714/723; 365/174

(58) Field of Classification Search .................. 714/763, 714/710, 711, 723; 365/174
See application file for complete search history.

(56) References Cited

U.S. PATENT DOCUMENTS

| 4,768,193 | A  | * | 8/1988  | Takemae ...................... 714/711 |
| 5,790,462 | A  | * | 8/1998  | McClure .................. 365/189.02 |
| 6,795,942 | B1 | * | 9/2004  | Schwarz ...................... 714/718 |
| 6,966,012 | B1 | * | 11/2005 | Gandhi ...................... 714/6.32 |

FOREIGN PATENT DOCUMENTS

| JP | 2-203500    | 8/1990 |
| JP | 2007-141364 | 6/2007 |

* cited by examiner

*Primary Examiner* — Guy Lamarre
(74) *Attorney, Agent, or Firm* — McGinn IP Law Group, PLLC

(57) ABSTRACT

A semiconductor memory device includes a data storage area wherein a plurality of data cells, respectively storing one bit of data, is arranged in a lattice form, a redundant data storage area that stores one bit parity data, the one bit parity data corresponding respectively to a line of data read out of the data storage area as a data group, a first switch section that receives a data group read out from the data storage area and a parity data bit, and a composite unit that receives an output of the first switch section and that generates correction data for the read data group, as based upon defect position information of the data storage area. The first switch section is selectively controlled to provide the parity data bit associated with the read data group as an input into the composite unit based on the defect position information.

16 Claims, 5 Drawing Sheets

SEMICONDUCTOR MEMORY DEVICE

BACKGROUND

1. Field of the Invention

The present invention relates to a semiconductor memory device, and more particularly, to a semiconductor memory device that corrects defective data stored in a read only memory (ROM) by using redundant data.

2. Description of Related Art

In some semiconductor devices, a defective element may occur during a manufacturing process, which causes a deterioration in yield. In particular, the recent increase in capacity of semiconductor memory devices makes it necessary to determine a chip containing a defective memory cell among a large number of cells, as a defective product. For this reason, in semiconductor memory devices, a predetermined number of defects are relieved using error correction techniques such as parity check and error correcting code (ECC), thereby preventing a deterioration in yield.

The error correction technique using the parity check is effective when the position of a bit error contained in data can be specified in advance. According to the error correction technique using the parity check, a calculation is performed to determine that the number of "1" or "0" bits included in the data is even or odd, and 1-bit parity data is generated. Then, the number of "1" or "0" bits included in the read data is calculated, and when the result obtained by the calculation does not match the parity data, the bit error specified in advance is inverted and output.

Meanwhile, the error correction technique using the ECC is effective when the position of a defect is not specified. According to the error correction technique using the ECC, an operation is carried out using parity data having a plurality of bits and data to be processed, so that the bit error present at an unspecified position can be corrected.

In this regard, Japanese Unexamined Patent Application Publication No. 2-203500 (Araki) discloses the error correction technique using the parity check. Further, Japanese Unexamined Patent Application Publication No. 2007-141364 (Sato) discloses the error correction technique using the ECC.

FIG. 4 shows a block diagram of a semiconductor memory device disclosed by Araki. As shown in FIG. 4, the semiconductor memory device disclosed by Araki includes a memory cell array 100, terminals 110, 120, 180, and 201 to 2016, a row decoder 130, a column decoder/sense amplifier 140, a data correcting section 150, a parity check circuit 160, a defective output memory 170, and out buffers 191 to 1916. The memory cell array 100 includes a data section 100a and a parity section 100b. The data section 100a stores data to be stored in the semiconductor memory device. The parity section 100b stores, in each row, a parity code generated based on data stored in each row of the data section 100a.

Further, the semiconductor memory device disclosed by Araki performs parity check in the parity check circuit 160 based on the data read out from the data section 100a and the parity code read out from the parity section 100b. The defective output memory 170 stores in advance the position in the column direction of the bit error occurring in the read data. The data correcting section 150 includes data correcting circuits 151 to 1516 respectively corresponding to the pieces of data read out from the data section 100a. Further, in the data correcting section 150, the data correcting circuit corresponding to the position in the column direction, at which the bit error occurs and which is stored in the defective output memory 170, corrects the data using the parity check result generated by the parity check circuit 160. The position is stored in the defective output memory 170. In the semiconductor memory device disclosed by Araki, the bit error is corrected in this manner and the correction data is output through the out buffers 191 to 1916.

Next, FIG. 5 shows a block diagram of a semiconductor memory device disclosed by Sato. As shown in FIG. 5, the semiconductor memory device disclosed by Sato includes a ROM circuit 301, a defective address storage circuit 302, a fuse data holding circuit 303, a relief determination circuit 304, an ECC circuit 305, a data holding circuit 306, an address matching circuit 107, a switching holding circuit 308, and a switching circuit 309.

The ROM circuit 301 includes a memory data area 301a that holds necessary memory data, and a parity data area 301b that stores parity data for correcting an error of the memory data. The defective address storage circuit 302 stores a defective address which is an address of memory data determined as an error among memory data stored in the memory data area 301a. The fuse data holding circuit 303 holds fuse data output from the defective address storage circuit 302. The relief determination circuit 304 determines whether memory data determined as defective data is present or not, that is, whether it is necessary to relieve the data, based on the fuse data output from the fuse data holding circuit 303. The ECC circuit 305 corrects the memory data, which is determined as an error, based on parity data, and generates relief data corresponding to the defective address. The data holding circuit 306 stores the relief data generated by the ECC circuit 305. The address matching circuit 307 compares an input address input to read out the memory data, with the defective address. The switching holding circuit 308 holds the comparison result of the address matching circuit 307. When the input address matches the defective address as a result of the comparison by the address matching circuit 307, the switching circuit 309 outputs the relief data corresponding to the defective address. When the input address does not match the defective address, the switching circuit 309 outputs the memory data corresponding to the input address.

As described above, in the semiconductor memory device disclosed by Sato, the relief data generated by the ECC circuit 305 is output when the input address corresponds to the defective address, and the memory data corresponding to the input address is output when the input address does not correspond to the defective address. In this case, according to the technique disclosed by Sato, the relief data is generated at the time of start-up of the semiconductor memory device, thereby preventing the ECC circuit 305 from operating in the subsequent operation, and realizing an increase in speed of the subsequent operation.

SUMMARY

In recent years, however, elements of semiconductor devices have been miniaturized. Along with the miniaturization of elements, delay faults in which data output is delayed tend to considerably increase. When the delay fault occurs, the timing of outputting data is uncertain depending on the degree of the fault. Accordingly, when the parity check or ECC operation is performed on data including defective data as in the techniques disclosed by Araki and Sato, an error may occur in the operation result depending on the length of the delay time. For example, when data input to an operation unit is inverted during the execution of the parity check or the ECC operation, a malfunction occurs during the subsequent data correction operation. That is, the techniques disclosed by Araki and Sato have a problem that it is difficult to correct data with accuracy when the delay fault occurs.

A first exemplary aspect of an embodiment of the present invention is a semiconductor memory device includes a data storage area wherein a plurality of data cells, respectively storing one bit of data, is arranged in a lattice form, a redundant data storage area that stores one bit parity data, the one bit parity data corresponding respectively to a line of data read out of the data storage area as a data group, a first switch section that receives a data group read out from the data storage area and a parity data bit associated with the read data group, and a composite unit that receives an output of the first switch section and that generates correction data for the read data group, as based upon defect position information of the data storage area. The first switch section is selectively controlled to provide the parity data bit associated with the read data group as an input into the composite unit based on the defect position information.

A second exemplary aspect of another embodiment of the present invention is a semiconductor memory device includes a data storage area wherein data cells storing one bit data is arranged in a lattice form, a redundant data storage area that stores one bit parity data, the one bit parity data corresponding respectively to a data group comprising a line of data in the data storage area, a first switch section that receives a data group read out from the data storage area and the parity data bit corresponding to the read data group, and outputs a data group for a parity operation, the data group for the parity operation being replaced by data specified by defect position information with the parity data, a composite unit that generates replacement data based on data included in the data group for the parity operation, and a second switch section that receives the data group and the replacement data, and outputs a read data group based on the defect position information as output data of the semiconductor memory device, the read data group being replaced by data specified by the defect position information with the correction data.

The semiconductor memory device according to an exemplary embodiment of the present invention generates the data group for parity operation in which the defective data specified by the defect position information among data included in the data group is replaced with the parity data. Further, the semiconductor memory device generates the correction data which is the replacement data for the defective data specified by the defect position information, based on the data group for parity operation. That is, the defective data generated due to a delay fault is not used in the operation for the correction data. Consequently, the semiconductor memory device according to an exemplary embodiment of the present invention is capable of performing data correction with accuracy also for defective data generated due to a delay fault.

The semiconductor memory device according to an exemplary embodiment of the present invention is capable of performing data correction with accuracy, irrespective of a fault mode of defective data.

BRIEF DESCRIPTION OF THE DRAWINGS

The above and other exemplary aspects, advantages and features will be more apparent from the following description of certain exemplary embodiments taken in conjunction with the accompanying drawings, in which.

DETAILED DESCRIPTION OF THE EXEMPLARY EMBODIMENTS

First Exemplary Embodiment

Figure 1:
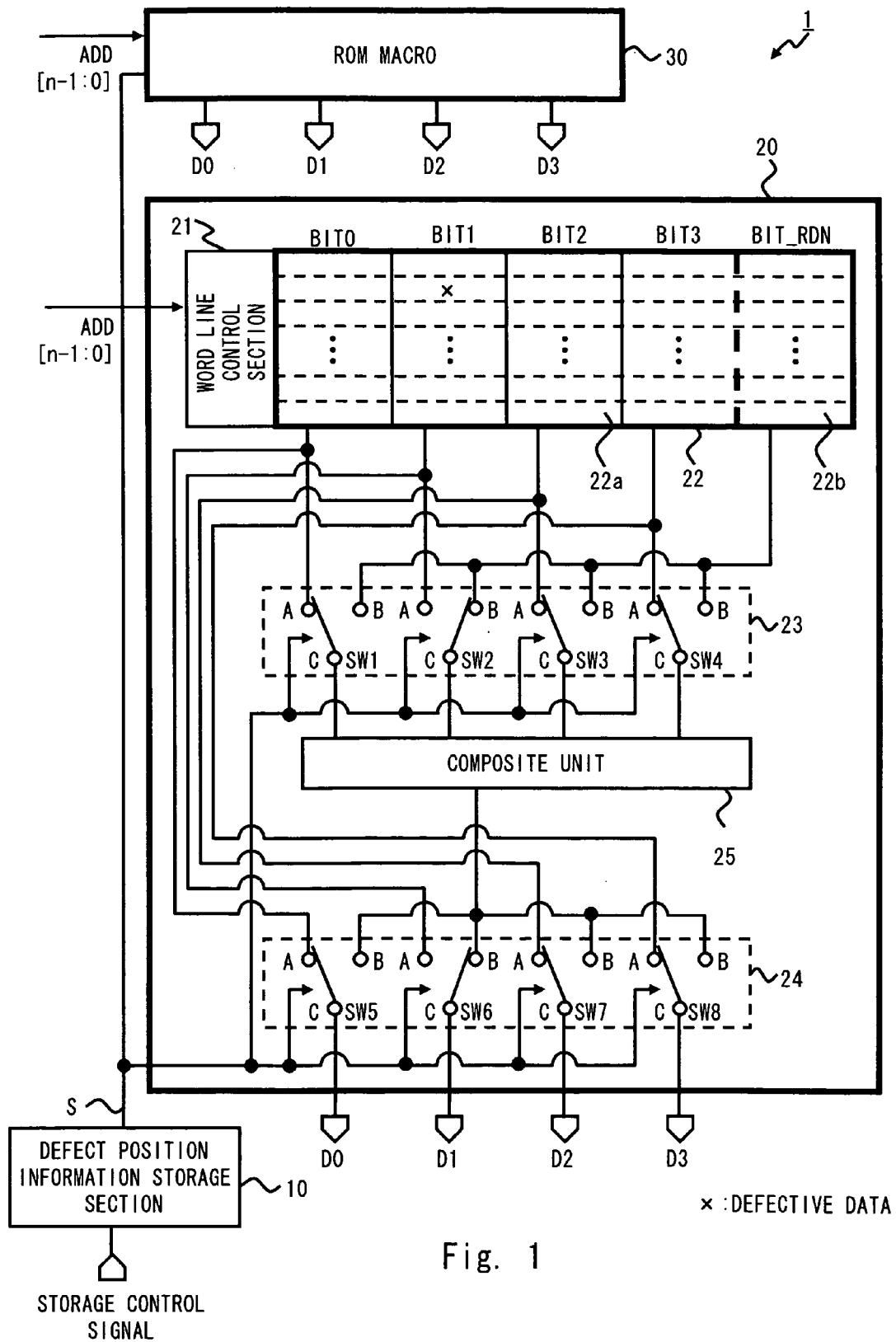
FIG. 1 is a block diagram showing a semiconductor memory device according to a first exemplary embodiment of the present invention.

Hereinafter, exemplary embodiments of the present invention will be described with reference to the drawings. FIG. 1 is a block diagram showing a semiconductor memory device 1 according to a first exemplary embodiment of the present invention. As shown in FIG. 1, the semiconductor memory device according to an exemplary embodiment of the present invention includes a defect position information memory 10 and read only memory (ROM) macros 20 and 30. Hereinafter, a description is given of an example in which the semiconductor memory device 1 includes a storage area provided to each ROM macro, and defect position information is given to each ROM macro. Note that exemplary embodiments of the present invention are not limited to the configuration in which the storage area is provided to each ROM macro.

The defect position information memory 10 stores position information of columns of a memory array area provided in a ROM macro including a bit error (the position information is hereinafter referred to as "defect position information S") based on a storage control signal input from the outside. The defect position information memory 10 includes a number of memory cells corresponding to the number of columns of the memory cell area, and outputs the defect position information S according to a state of each memory cell, for example. Each memory cell is, for example, a nonvolatile memory cell such as a fuse. The defect position information S stored in a memory cell is position information located in a certain column of the memory array area, which is specified based on information on defective data that is obtained by conducting a test for the ROM macro in advance.

The ROM macros 20 and 30 have substantively the same configuration, so the ROM macro 20 will be described as an example. The ROM macro 20 includes a word line control section 21, a memory array area 22, a first switch section 23, a second switch section 24, and a composite unit 25.

The memory array area 22 includes a data storage area 22a and a redundant data storage area 22b. The memory array area 22 includes memory cells that store data and are arranged in a lattice form. The word line control section 21 selects the memory cells of the memory area 22 for each row based on address information ADD input from the outside. Further, bit lines Bit0 to Bit3 and Bit_RDN define the columns of the memory array area 22. The data storage area 22a stores data to be stored in the semiconductor memory device 1. The data stored in the data storage area 22a is read out from each row. A group of read data items is hereinafter referred to as a data group. The redundant data storage area 22b stores parity data. The parity data is generated so as to correspond to each data group. For example, an even parity value or an odd parity value of a corresponding data group is stored. Specifically, assuming that a certain data group indicates "1101", the even parity value is "1" and the odd parity value is "0". Further, the data group and parity data, which are stored in the same row, are read out simultaneously from the memory array area 22.

The first switch section 23 receives the data group read out from the data storage area 22a and the parity data read out from the redundant data storage area 22b, and outputs a data group for parity operation in which data stored at a position specified by the defect position information S among data included in the data group is replaced with the parity data. The first switch section 23 includes switching circuits SW1 to SW4. Each of the switching circuits SW1 to SW4 includes terminals A to C. Further, each of the switching circuits SW1 to SW4 is switched to one of a state in which the terminal A and the terminal C are connected to each other and a state in which the terminal B and the terminal C are connected to each other, according to the defect position information S. Each terminal A is connected to the corresponding bit line of the data storage area 22a, and each terminal B is connected to the bit line Bit_RDN of the redundant data storage area 22b. Each terminal C of the switching circuits SW1 to SW4 serves as an output terminal of the first switch section 23. A group of data output from each terminal C corresponds to the data group for parity operation. The data group for parity operation is input to the composite unit 25.

The second switch section 24 receives a data group read out from the data storage area 22a and replacement data output from the composite unit 25, and outputs the read data group in which data located at a position specified by the defect position information S among data contained in the data group is replaced with the replacement data. The second switch section 24 includes switching circuits SW5 to SW8. Each of the switching circuits SW5 to SW8 includes the terminals A to C. Further, each of the switching circuits SW5 to SW8 is switched to one of the state in which the terminal A and the terminal C are connected to each other and the state in which the terminal B and the terminal C are connected to each other, according to the defect position information S. Each terminal A is connected to the corresponding bit line of the data storage area 22a, and each terminal B is connected to an output of the composite unit 25. The terminals C of the switching circuits SW5 to SW8 serve as output terminals of the second switch section 24 and are connected to output terminals D0 to D3, respectively. A group of data output from the output terminals D0 to D3 corresponds to the read data group.

The composite unit 25 calculates the replacement data based on pieces of data included in the data group for parity operation. The composite unit 25 according to an exemplary embodiment of the present invention carries out an operation on the data group for parity operation according to an operation method for parity operation that determines the value of parity data stored in the redundant data storage area 22b. For example, when the value of parity data is determined using even parity, the composite unit 25 calculates even parity for the data group for parity operation. Then, the value of the even parity is used as the replacement data.

Note that, in the above description, when the data group read out from the data storage area 22a includes a bit error (hereinafter, referred to as "defective data") the defect position information S indicates a position in a certain column in which the defective data of the data group is present. The first switch section 23 outputs the data group for parity operation in which the defective data indicated by the defect position information S is replaced with the parity data. Further, the replacement data calculated by the composite unit 25 is correction data indicating the value obtained after correcting the defective data.

Next, a description is given of operations of the semiconductor memory device 1 according to an exemplary embodiment of the present invention. First, an operation carried out when the defective data is not included in the memory array area 22 is described. In this case, since defective data is not present, the defect position information S indicates that defective data is not included in any of the columns. Based on the defect position information S, the switching circuits SW1 to SW4 of the first switch section 23 and the switching circuits SW5 to SW8 of the second switch section 24 are each switched to the state in which the terminal A and the terminal C are connected to each other. As a result, the data group read out from the data storage area 22a is not changed at all and is output as the read data group from the output terminals D0 to D3 through the second switch section 25. Note that the replacement data output from the composite unit 24 in this case is not output to the outside.

Next, a description is given of a case where defective data is included in the data stored in the memory array area 22. In the example shown in FIG. 1, defective data is present in the column of the bit line Bit1. In this case, the defect position information S indicates that defective data is present in the bit line Bit1. Based on the defect position information S, the switching circuit SW2 corresponding to the bit line Bit1 is switched to the state in which the terminal B and the terminal C are connected to each other in the first switch section 23. Also in the second switch section 24, based on the defect position information S, the switching circuit SW6 corresponding to the bit line Bit1 in the second switch section 24 is switched to the state in which the terminal B and the terminal C are connected to each other. In this case, the other switching circuits are in the state in which the terminal A and the terminal C are connected to each other.

By switching the connection state of each of the switching circuits SW1-SW4, the data group for parity operation output from the first switch section 23 includes data corresponding to the bit lines Bit0, Bit2, and Bit3 and parity data. That is, the data group for parity operation consists of data read out through the bit lines Bit0, Bit2 and Bit3 and the data replaced with the parity data which is corresponding to the bit line Bit1.

Then, the composite unit 25 performs parity operation on the data group for parity operation, and outputs correction data. The correction data is supplied to the second switch section 24. According to the connection state of each of the switching circuits, the second switch section 24 outputs, as the read data group, the data group which consists of data read out through the bit lines Bit0, Bit2 and Bit3, and data replaced a collection data. This replaced data is the correction data which is replaced with data corresponding to the bit line Bit1.

Note that, when the data stored in the data storage area 22a includes defective data, the operation for replacing data with correction data is also performed on data groups including no defective data according to an exemplary embodiment of the present invention. When a data group for parity operation including parity data is generated also for the data group including no defective data and when the composite unit 25 performs the operation on the data group for parity operation, the value of the data to be replaced is the same as the value of the correction data (or replacement data) output through the operation. Accordingly, in the semiconductor memory device 1 according to an exemplary embodiment of the present invention, the ROM macro receiving a piece of defect position information S performs the operation for replacing data with correction data (or replacement data) output from the composite unit 25, also for data groups read out from any of the rows.

An operation method according to an exemplary embodiment of the present invention is herein described by giving a specific example of the parity operation performed by the composite unit 25. In the following, a description is given assuming that, for example, a data group stored in the first row of the data storage area 22a indicates Bit0, Bit1, Bit2, Bit3=1, 1, 0, 1, and a data group stored in the second row indicates Bit0, Bit1, Bit2, Bit3=1, 0, 0, 1.

In this case, parity data for even parity corresponding to the data group stored in the first row indicates "1". Meanwhile, parity data for even parity corresponding to the data group stored in the second row indicates "0" When the data corresponding to the bit line Bit1 in the first row is damaged, the data group read out from the first row indicates Bit0, Bit1, Bit2, Bit3=1, 0, 0, 1.

The semiconductor memory device 1 outputs a data group of 1, 1, 0, 1 which consists of data read out through the bit lines Bit0, Bit2 and Bit3 in the first row and data replaced the data corresponding to the bit line Bit1 with the parity data, as a data group for parity operation corresponding to the first row. Then, the composite unit 25 calculates the even parity for the data group for parity operation corresponding to the first row, and outputs "1" as correction data. After that, the second switch section 24 replaces the data corresponding to the bit line Bit1 in the data group corresponding to the first row, with the correction data, and outputs the read data group of 1, 1, 0, 1.

On the other hand, also for the data group corresponding to the second row, which includes no defective data, the data group for parity operation including parity data is generated. The data group for parity operation corresponding to the second row is a data group of 1, 0, 0, 1 which is read out from the second row and in which the data corresponding to the bit line Bit1 is replaced with the parity data. Then, the composite unit 25 calculates the even parity for the data group for parity operation corresponding to the second row, and outputs "0" as replacement data. That is, the value of the replacement data is the same as the value of the data corresponding to the bit line Bit1 in the second row. Then, the second switch section 24 replaces the data corresponding to the bit line Bit1 in the data group corresponding to the second row, with the replacement data, and outputs the read data group of 1, 0, 0, 1.

As described above, when defective data is present, the semiconductor memory device 1 according to an exemplary embodiment of the present invention specifies the column including the defective data, and replaces the data corresponding to the specified row with parity data, thereby generating the data group for parity operation. Then, the semiconductor memory device 1 performs the parity operation on the data group for parity operation, generates correction data for correcting the defective data, and replaces the defective data with the correction data, thereby performing error correction. That is, the semiconductor memory device 1 according to an exemplary embodiment of the present invention performs error correction using data excluding the defective data. As a result, the semiconductor memory device 1 according to an exemplary embodiment of the present invention is capable of performing error correction without any effect of a defect or fault, even if defective data is generated due to a delay fault of a memory cell.

Meanwhile, the technique disclosed by Sato requires multi-bit data as parity data so as to perform error correction using the ECC. Accordingly, the technique disclosed by Sato has a problem that it is difficult to cope with an increase in storage capacity, since the data capacity for error correction is large. On the other hand, the semiconductor memory device 1 according to an exemplary embodiment of the present invention performs the error correction by executing the parity operation using 1-bit parity data. For this reason, the ratio of the quantity of parity data to the storage capacity is small, and thus the semiconductor memory device 1 according to an exemplary embodiment of the present invention can cope with an increase in capacity.

Further, in the technique disclosed by Sato, it is necessary to compare an input address with an address containing defective data, since the defective data to be replaced with corrected data is output. Accordingly, the technique disclosed by Sato has a problem that it is necessary to perform the address comparison operation every time data is read out, which leads to an undesirable decrease in operation speed. On the other hand, the semiconductor memory device 1 according to an exemplary embodiment of the present invention is capable of reading out data without performing the address comparison operation. For this reason, the semiconductor memory device 1 is suitable for high speed operation. Note that the composite unit 25 according to an exemplary embodiment of the present invention is capable of performing the parity operation by using only the number of "1" or "0" bits included in the data group. Accordingly, the time required for the operation is extremely shorter than that required for the address comparison operation, and thus the operation speed is hardly reduced.

Furthermore, when a circuit for coping with large-scale correction such as the ECC is provided to a semiconductor memory device having a low error rate, the chip area undesirably increases. In the semiconductor memory device 1 according to an exemplary embodiment of the present invention, however, the operations of blocks including the first switch section 23, the composite unit 25, and the second switch section 24 are extremely simple, which contributes to a reduction in circuit size. Moreover, the semiconductor memory device 1 according to an exemplary embodiment of the present invention is capable of performing error correction at high speed, when it is determined in advance that the number of columns including defective data is one. In other words, the semiconductor memory device 1 according to an exemplary embodiment of the present invention is particularly effective, since a small circuit size and high-speed operation can be realized when the error rate in the manufacturing process is low. It is impossible for a semiconductor memory device functioning as a ROM to rewrite data after the manufacturing process is completed. Accordingly, data that is non-defective before shipping is less likely to become defective after shipping. In view of the foregoing, the defect position can be easily specified in the ROM, and the semiconductor memory device 1 according to an exemplary embodiment of the present invention is particularly effective in efficiently manufacturing a semiconductor memory device functioning as a ROM.

Second Exemplary Embodiment

Figure 2:
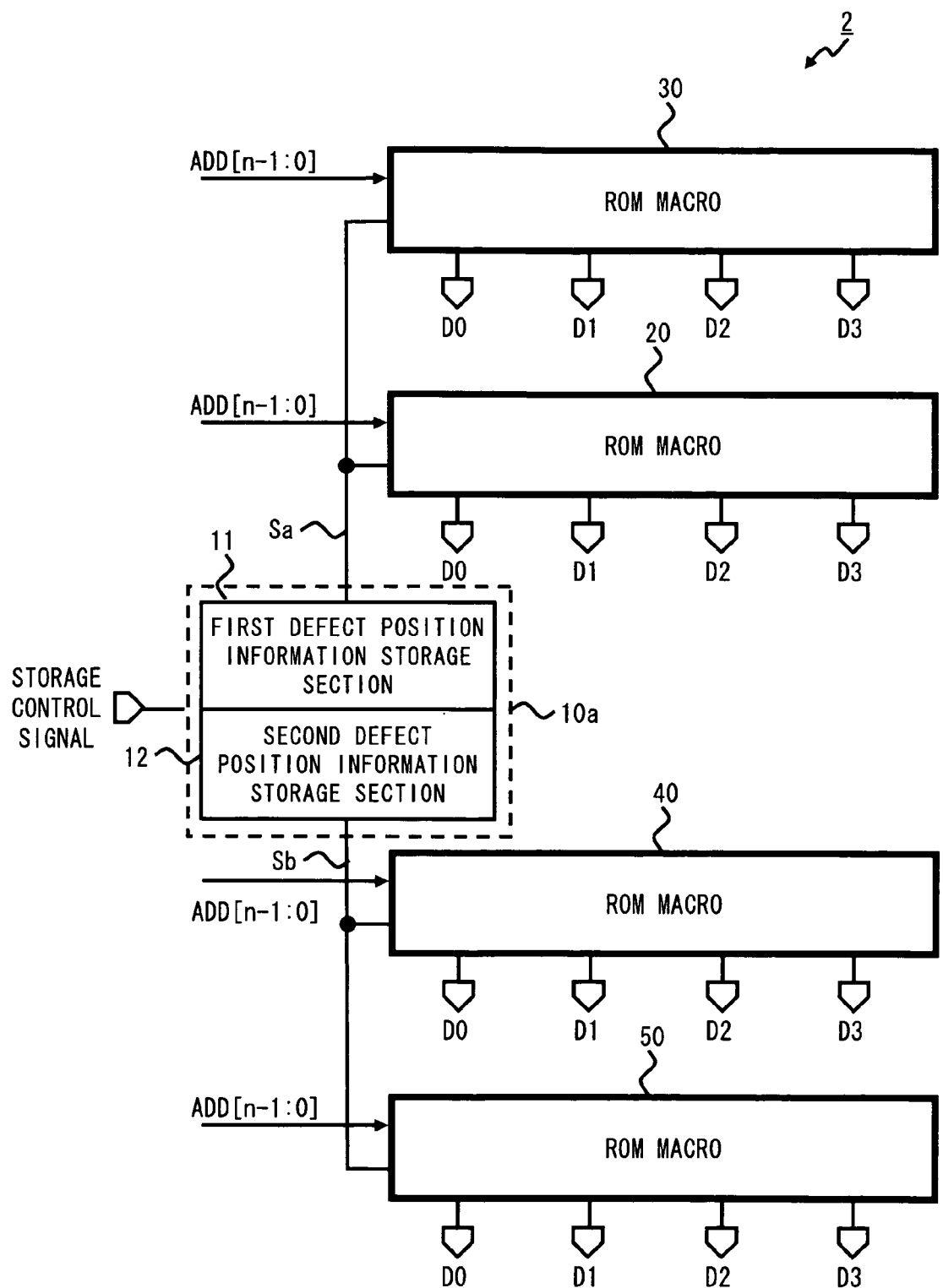
FIG. 2 is a block diagram showing a semiconductor memory device according to a second exemplary embodiment of the present invention.

FIG. 2 is a block diagram showing a semiconductor memory device 2 according to a second exemplary embodiment of the present invention. As shown in FIG. 2, the semiconductor memory device 2 includes two sets of semiconductor memory devices 1. Further, the semiconductor memory device 2 includes a defect position information memory 10a including a first defect position information memory 11 and a second defect position information memory 12. In the semiconductor memory device 2, the ROM macros 20 and 30 are provided to correspond to the first defect position information memory 11, and ROM macros 40 and 50 are provided to correspond to the second defect position information memory 12. Each of the ROM macros 20 to 50 has substantially the same configuration as that of the ROM macro 20 described in the first exemplary embodiment.

The first defect position information memory 11 outputs first defect position information Sa, and the second defect position information memory 12 outputs second defect position information Sb. The first defect position information Sa and the second defect position information Sb are independent defect position information. That is, the first defect position information Sa and the second defect position information Sb may indicate the same defect position or may indicate different defect positions.

In this manner, a plurality of pieces of defect position information are provided depending on the number of ROM macros so that more defective data can be relieved. In this case, the number of defect position information is determined depending on the storage capacity achieved by providing the ROM macros and the error rate in the manufacturing process, which effectively increases an error relieving rate with respect to the circuit size.

Third Exemplary Embodiment

Figure 3:
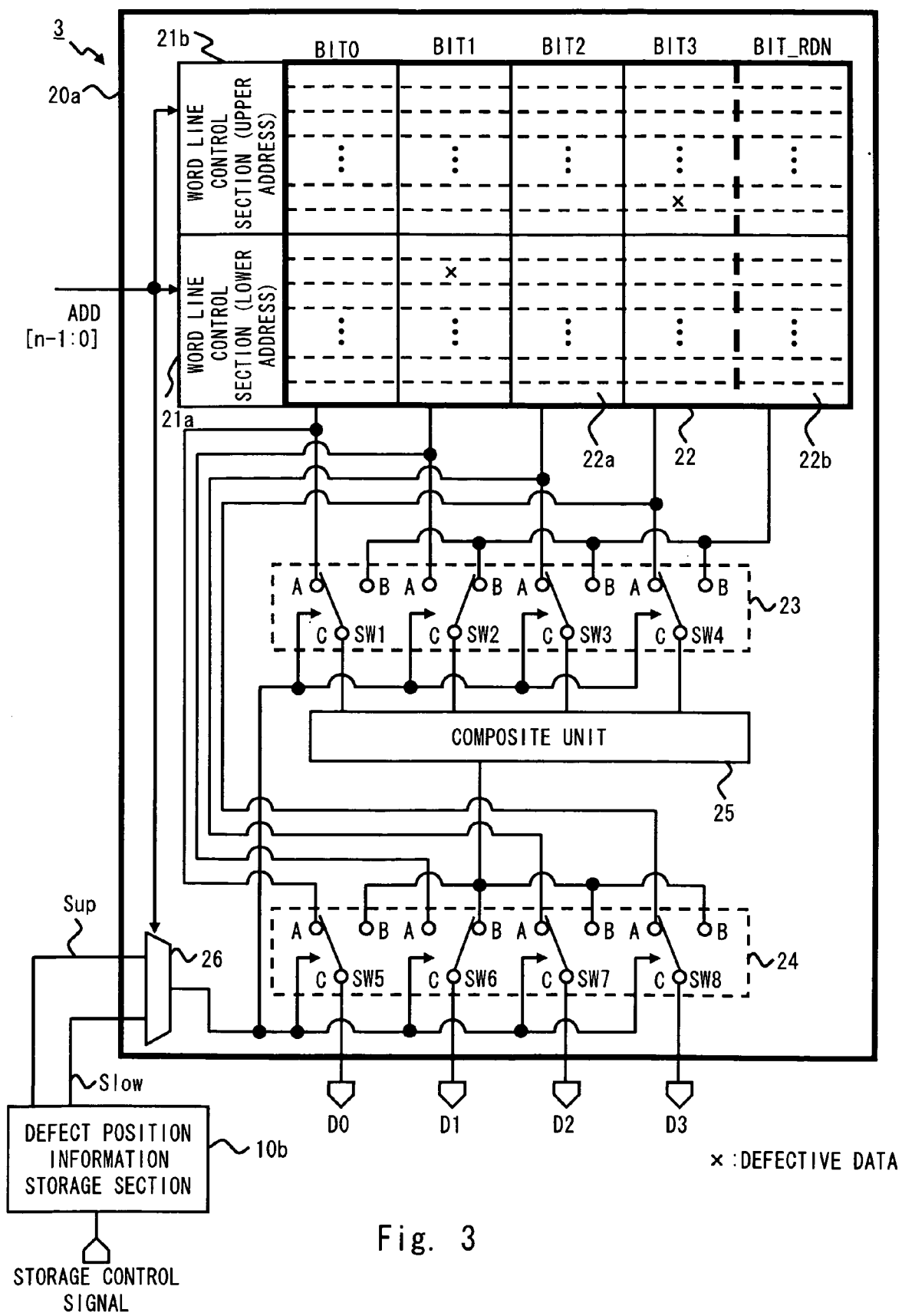
FIG. 3 is a block diagram showing a semiconductor memory device according to a third exemplary embodiment of the present invention.
Figure 4:
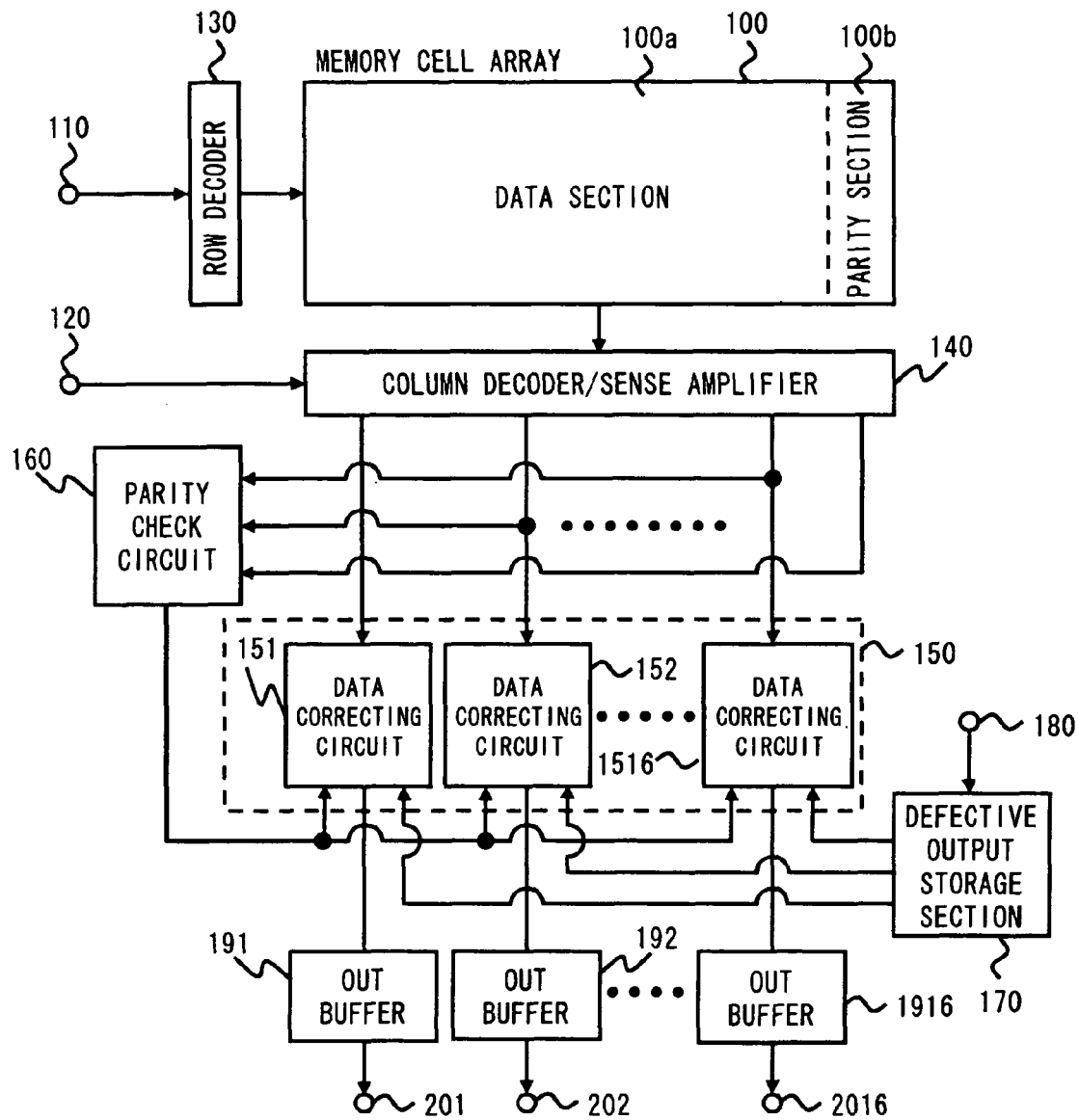
FIG. 4 is a block diagram showing a semiconductor memory device disclosed by Araki.
Figure 5:
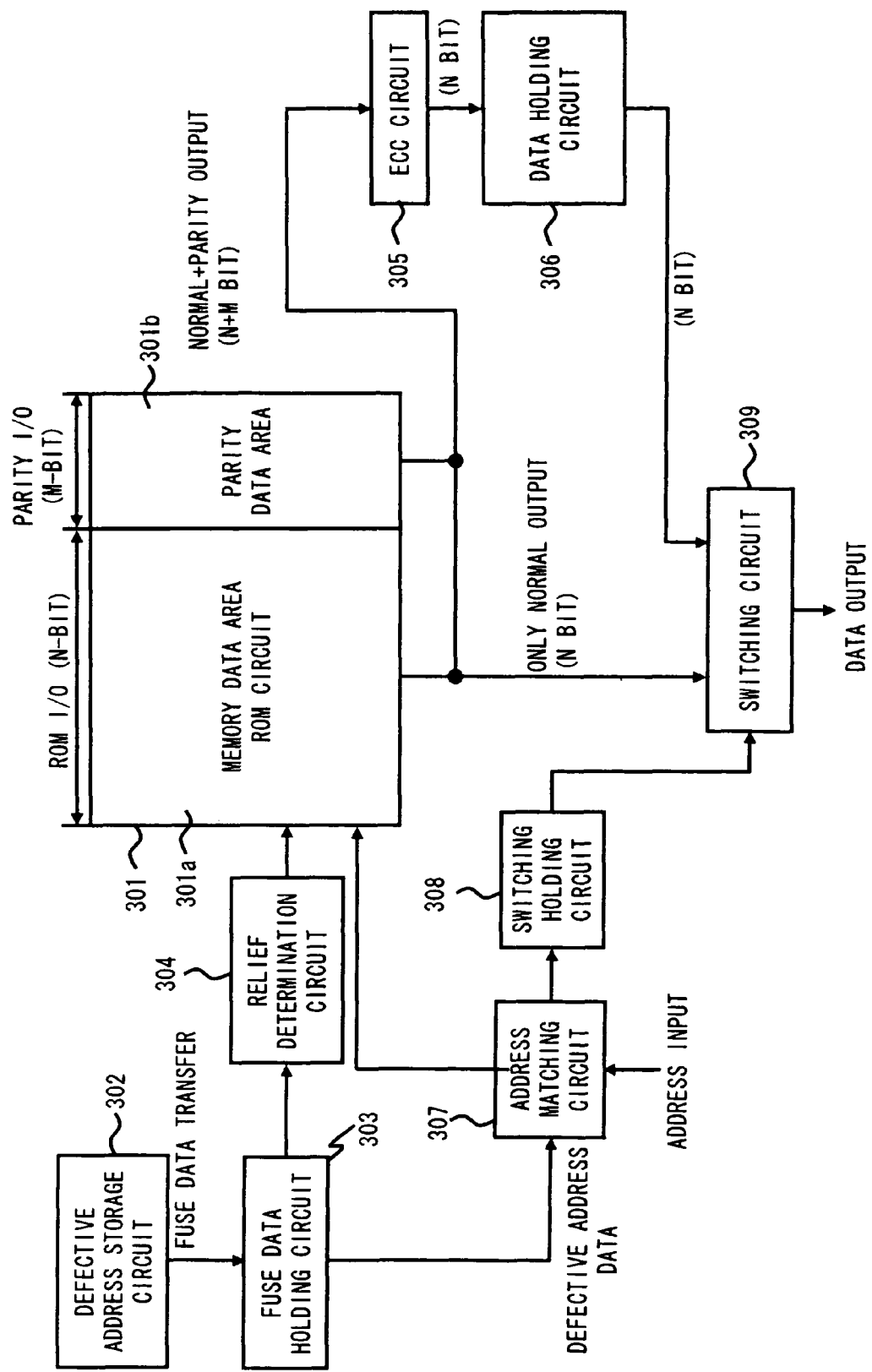
FIG. 5 is a block diagram showing a semiconductor memory device disclosed by Sato.

FIG. 3 is a block diagram showing a semiconductor memory device 3 according to a third exemplary embodiment of the present invention. According to the third exemplary embodiment, the memory array area 22 provided in the ROM macro 20 is divided into a first memory array area specified by an upper-address-side row address and a second memory array area specified by a lower-address-side row address. Further, the independent defect position specification information are supplied to the first memory array area and the second memory array area, respectively.

For this reason, the semiconductor memory device 3 includes a selector 26 provided in the ROM macro. Further, a defect position information memory 10b outputs defect position information Sup for an upper address and defect position information Slow for a lower address. When the selector 26 receives the address information ADD and when the address information ADD indicates the upper address, the selector 26 outputs the defect position information Sup for the upper address as the defect position information to each of the first switch section 23 and the second switch section 24. Further, when the address information ADD indicates the lower address, the selector 26 outputs the defect position information Slow for the lower address as the defect position information to each of the first switch section 23 and the second switch section 24.

In this manner, the memory array area included in a single ROM macro is managed by being divided into areas using row addresses so that the more defective data can be relieved in a single ROM macro. That is, the semiconductor memory device 3 is capable of relieving more defective data as compared to the semiconductor memory device 1.

Note that the present invention is not limited to the above exemplary embodiments, and various modifications can be made without departing from the spirit and scope of the present invention. For example, the operation method for the composite unit 25 is not limited to the method according to the above exemplary embodiment, but can be arbitrarily changed depending on the error correction method. Further, the number of bit lines provided in the data storage area is four according to the above exemplary embodiments, but the number of bit lines can be arbitrarily changed depending on the design of the ROM macro.

The first to third exemplary embodiments can be combined as desirable by one of ordinary skill in the art.

While the invention has been described in terms of several exemplary embodiments, those skilled in the art will recognize that the invention can be practiced with various modifications within the spirit and scope of the appended claims and the invention is not limited to the examples described above.

Further, the scope of the claims is not limited by the exemplary embodiments described above.

Furthermore, it is noted that, Applicant's intent is to encompass equivalents of all claim elements, even if amended later during prosecution.

What is claimed is:

1. A semiconductor memory device, comprising:
a data storage area wherein a plurality of data cells, respectively storing one bit of data, is arranged in a lattice form;
a redundant data storage area that stores one bit parity data, the one bit parity data corresponding respectively to a line of data read out of the data storage area as a data group;
a first switch section that receives a data group read out from the data storage area and a parity data bit associated with the read data group; and
a composite unit that receives an output of the first switch section and that generates correction data for the read data group, as based upon defect position information of the data storage area,
wherein the first switch section is selectively controlled to provide the parity data bit associated with the read data group as an input into the composite unit based on the defect position information.

2. The semiconductor memory device of claim 1, further comprising a defect position wherein is stored defect position information for the data storage area.

3. The semiconductor memory device of claim 1, further comprising a second switch section receiving, as input data, an output of the composite unit and the read data group, wherein the second switch section provides output data of the semiconductor memory as data stored in the data storage section as corrected by the composite unit, and wherein the second switch section is selectively controlled by the defect position information.

4. The semiconductor memory device of claim 3, wherein the composite unit determines a correction if no more than one bit in the read data group has a defect.

5. The semiconductor memory device of claim 4, wherein the first switch section switches the associated parity data bit as an into the composite unit at a bit position corresponding to the single bit defect in the read data group.

6. The semiconductor memory device of claim 5, wherein the second switch section selectively switches the output of the composite unit to be an output data bit of the semiconductor memory device, at the bit position corresponding to the single bit defect in the read data group, and otherwise switches, as output data of the semiconductor memory device, all data bits of the read data group having no defect.

7. The semiconductor memory device according to claim 1, wherein the data group is stored in a same row in the lattice in the data storage area.

8. The semiconductor memory device according to claim 1, wherein the data storage area and the redundant data storage area comprise a read only memory (ROM).

9. The semiconductor memory device according to claim 1, wherein the defect position information specifies a column number including defective data of the data storage area.

10. The semiconductor memory device according to claim 1, wherein the composite unit carries out an operation on the data group for the parity operation according to a parity operation that calculates the parity data from data included in the data group.

11. The semiconductor memory device according to claim 1, wherein the first switch section and the second switch section include a plurality of switch circuits, a number of the switch circuits corresponding to a number of bits of the data group, the switch circuits included in the first switch section selectively output one of the parity data and data included in the data group based on the defective position information, and the switch circuits included in the second switch section select and output one of the correction data and data included in the data group.

12. The semiconductor memory device according to claim 1, wherein the defective position information includes a plurality of defective position information indicating different defective data positions, the semiconductor memory device further comprises a plurality of sets including a data storage area, a redundant data storage area, first and second switch sections and a composite unit, and the set corresponds to each of the defective position information.

13. The semiconductor memory device according to claim 1, wherein the defective position information includes a first defective position information corresponding to upper-address information among address information indicating one row of the data storage area, and a second defective position information corresponding to lower-address information among the address information, and the semiconductor memory device further comprises a selector that selects one of the first defective position information and the second defective position information based on the address information, and outputs the selected defective position information for the first switch section and the second switch section.

14. The semiconductor memory device according to claim 1, wherein the semiconductor memory device further comprises a defective position information memory that stores the defective position information as nonvolatile information.

15. The semiconductor memory device according to claim 1, wherein data stored in the plurality of the data cells and the redundancy cells is determined in a manufacturing stage.

16. A semiconductor memory device, comprising:
a data storage area wherein data cells storing one bit data is arranged in a lattice form;
a redundant data storage area that stores one bit parity data, the one bit parity data corresponding respectively to a data group comprising a line of data in the data storage area;
a first switch section that receives a data group read out from the data storage area and the parity data bit corresponding to the read data group, and outputs a data group for a parity operation, the data group for the parity operation being replaced by data specified by defect position information with the parity data;
a composite unit that generates replacement data based on data included in the data group for the parity operation; and
a second switch section that receives the data group and the replacement data, and outputs a read data group based on the defect position information as output data of the semiconductor memory device, the read data group being replaced by data specified by the defect position information with the correction data.

* * * * *